(12) United States Patent
Dunn (10) Patent No.: US 8,879,042 B2
(45) Date of Patent: Nov. 4, 2014

(54) ISOLATED COOLING SYSTEM HAVING AN INSULATOR GAP AND FRONT POLARIZER

(75) Inventor: William Dunn, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 772 days.

(21) Appl. No.: 12/237,365

(22) Filed: Sep. 24, 2008

(65) Prior Publication Data

US 2009/0135365 A1 May 28, 2009

Related U.S. Application Data

(63) Continuation-in-part of application No. 12/234,307, filed on Sep. 19, 2008, and a continuation-in-part of application No. 12/234,360, filed on Sep. 19, 2008, and a continuation-in-part of application No. 12/235,200, filed on Sep. 22, 2008, and a continuation-in-part of application No. 11/941,728, filed on Nov. 16, 2007, and a continuation-in-part of application No. 12/191,384, filed on Aug. 14, 2008, now abandoned, and a continuation-in-part of application No. 12/125,046, filed on May 21, 2008.

(60) Provisional application No. 61/057,599, filed on May 30, 2008, provisional application No. 61/039,454, filed on Mar. 26, 2008.

(51) Int. Cl.
*G02F 1/1333* (2006.01)
*H05K 7/20* (2006.01)

(52) U.S. Cl.
CPC ...... *H05K 7/20972* (2013.01); *G02F 1/133385* (2013.01)
USPC .............................. 349/161; 349/58; 361/678

(58) Field of Classification Search
CPC ................................................ G02F 1/133385
USPC .......................................... 349/161; 361/678
See application file for complete search history.

(56) References Cited

U.S. PATENT DOCUMENTS

| 4,093,355 A | 6/1978 | Kaplit et al. |
| 4,593,978 A | 6/1986 | Mourey et al. |

(Continued)

FOREIGN PATENT DOCUMENTS

| GB | 2402205 | 1/2004 |
| JP | 03153212 | 7/1991 |

(Continued)

OTHER PUBLICATIONS

Nagoya Electric Works Co Ltd., May 26, 2005, Machine Translation of JP 2005-134849 A from Patents Abstracts of Japan website, all pages.*

(Continued)

*Primary Examiner* — Dennis Y Kim
(74) *Attorney, Agent, or Firm* — Standley Law Group LLP (57) ABSTRACT

An exemplary embodiment relates to a cooling system and a method for cooling an electronic display. A preferred embodiment includes a transparent gas cooling chamber. The transparent gas cooling chamber may have a linear polarizer. The components in the system are preferably housed within the electronic display housing. The cooling chamber defines a gas compartment that is anterior to and coextensive with the electronic display surface. Fans may be used to propel the isolated gas through the cooling chamber. The circulating gas removes heat directly from the electronic display surface by convection. The isolated gas is transparent or at least semi-transparent. The image quality of an exemplary embodiment remains essentially unchanged, even though the gas is flowing through a narrow channel over the visible face of the electronic display surface.

20 Claims, 11 Drawing Sheets

(56) References Cited

U.S. PATENT DOCUMENTS

| | | | |
|---|---|---|---|
| 4,634,225 A | | 1/1987 | Haim et al. |
| 4,952,925 A | * | 8/1990 | Haastert ............... 345/87 |
| 5,029,982 A | | 7/1991 | Nash |
| 5,088,806 A | | 2/1992 | McCartney et al. |
| 5,247,374 A | | 9/1993 | Terada |
| 5,559,614 A | | 9/1996 | Urbish et al. |
| 5,748,269 A | | 5/1998 | Harris et al. |
| 5,767,489 A | | 6/1998 | Ferrier |
| 5,818,010 A | | 10/1998 | McCann |
| 5,869,919 A | * | 2/1999 | Sato et al. ............... 313/17 |
| 5,991,153 A | * | 11/1999 | Heady et al. ............ 361/704 |
| 6,089,751 A | | 7/2000 | Conover et al. |
| 6,157,432 A | | 12/2000 | Helbing |
| 6,191,839 B1 | | 2/2001 | Briley |
| 6,392,727 B1 | | 5/2002 | Larson et al. |
| 6,417,900 B1 | | 7/2002 | Shin et al. |
| 6,504,713 B1 | * | 1/2003 | Pandolfi et al. ......... 361/695 |
| 6,535,266 B1 | | 3/2003 | Nemeth et al. |
| 6,628,355 B1 | | 9/2003 | Takahara |
| 6,839,104 B2 | | 1/2005 | Taniguchi et al. |
| 6,885,412 B2 | | 4/2005 | Ohnishi et al. |
| 6,909,486 B2 | | 6/2005 | Wang et al. |
| 6,943,768 B2 | | 9/2005 | Cavanaugh et al. |
| 6,961,108 B2 | | 11/2005 | Wang et al. |
| 7,059,757 B2 | | 6/2006 | Shimizu |
| 7,083,285 B2 | | 8/2006 | Hsu |
| 7,535,543 B2 | * | 5/2009 | Dewa et al. ............. 349/161 |
| 2001/0001459 A1 | * | 5/2001 | Savant et al. ............ 216/24 |
| 2001/0019454 A1 | * | 9/2001 | Tadic-Galeb et al. .... 359/649 |
| 2002/0033919 A1 | * | 3/2002 | Sanelle et al. ........... 349/122 |
| 2002/0101553 A1 | | 8/2002 | Enomoto et al. |
| 2002/0126248 A1 | | 9/2002 | Yoshida |
| 2002/0149714 A1 | * | 10/2002 | Anderson et al. ........ 349/59 |
| 2002/0154255 A1 | * | 10/2002 | Gromatzky et al. ...... 349/60 |
| 2003/0007109 A1 | | 1/2003 | Park |
| 2004/0036834 A1 | | 2/2004 | Ohnishi et al. |
| 2004/0105159 A1 | * | 6/2004 | Saccomanno et al. .... 359/599 |
| 2004/0165139 A1 | | 8/2004 | Anderson et al. |
| 2005/0073632 A1 | * | 4/2005 | Dunn et al. .............. 349/110 |
| 2005/0286131 A1 | * | 12/2005 | Saxena et al. ........... 359/586 |
| 2006/0082271 A1 | | 4/2006 | Lee |
| 2006/0132699 A1 | | 6/2006 | Cho et al. |
| 2006/0209266 A1 | | 9/2006 | Utsunomiya |
| 2007/0151664 A1 | | 7/2007 | Shin |
| 2007/0206158 A1 | * | 9/2007 | Kinoshita et al. ......... 353/52 |

FOREIGN PATENT DOCUMENTS

| | | |
|---|---|---|
| JP | 08194437 | 7/1996 |
| JP | 11160727 | 6/1999 |
| JP | 2002158475 | 5/2002 |
| JP | 2005134849 | 5/2005 |
| JP | 200829274 | 12/2008 |
| KR | 20060016469 | 2/2006 |
| KR | 100666961 | 1/2007 |
| KR | 1020070070675 | 7/2007 |
| WO | WO2005079129 | 8/2005 |

OTHER PUBLICATIONS

Zeef, Hubing, EMC analysis of 18' LCD Monitor, Aug. 2000, 1 page.

* cited by examiner

ISOLATED COOLING SYSTEM HAVING AN INSULATOR GAP AND FRONT POLARIZER

CROSS-REFERENCE TO RELATED APPLICATIONS

This application is a non-provisional patent application and claims priority to U.S. Provisional Application Nos. 61/057,599 filed May 30, 2008 and 61/039,454 filed Mar. 26, 2008 which are herein incorporated by reference in their entirety. This application is also a continuation in part of U.S. patent application Ser. No. 11/941,728 filed Nov. 16, 2007, which is hereby incorporated by reference in its entirety. This application is also a continuation in part of U.S. patent application Ser. No. 12/125,046 filed May 21, 2008, which is hereby incorporated by reference in its entirety. This application is also a continuation in part of U.S. patent application Ser. No. 12/191,834 filed Aug. 14, 2008, which is hereby incorporated by reference in its entirety. This application is also a continuation in part of U.S. patent application Ser. No. 12/234,307 filed Sep. 19, 2008, which is hereby incorporated by reference in its entirety. This application is also a continuation in part of U.S. patent application Ser. No. 12/234,360 filed Sep. 19, 2008. This application is also a continuation in part of U.S. patent application Ser. No. 12/235,200 filed Sep. 22, 2008.

TECHNICAL FIELD

This invention generally relates to cooling systems. More particularly, exemplary embodiments relate to cooling systems for use with electronic displays, wherein the solar loading of the electronic display is reduced.

BACKGROUND AND SUMMARY OF THE INVENTION

Conductive and convective heat transfer systems for electronic displays are known. These systems of the past generally attempt to remove heat from the electronic components in a display through as many sidewalls of the display as possible. In order to do this, the systems of the past have relied primarily on fans for moving air past the components to be cooled and out of the display. In some cases, the heated air is moved into convectively thermal communication with fins. Some of the past systems also utilize conductive heat transfer from heat producing components directly to heat conductive housings for the electronics. In these cases, the housings have a large surface area, which is in convective communication with ambient air outside the housings. Thus, heat is transferred convectively or conductively to the housing and is then transferred into the ambient air from the housing by natural convection.

While such heat transfer systems have enjoyed a measure of success in the past, improvements to displays require even greater cooling capabilities.

In particular, cooling devices for electronic displays of the past have generally used convective heat dissipation systems that function to cool an entire interior of the display by one or more fans and fins, for example. By itself, this is not adequate in many climates, especially when radiative heat transfer from the sun through a display window becomes a major factor. In many applications and locations 200 Watts or more of power through such a display window is common. Furthermore, the market is demanding larger screen sizes for displays. With increased electronic display screen size and corresponding display window size more heat will be generated and more heat will be transmitted into the displays.

In the past, many displays have functioned satisfactorily with ten or twelve inch screens. Now, many displays are in need of screens having sizes greater than or equal to twenty-four inches that may require improved cooling systems. For example, some outdoor applications call for forty-seven inch screens and above. With increased heat production with the larger screens and radiative heat transfer from the sun through the display window, heat dissipation systems of the past, which attempt to cool the entire interior of the display with fins and fans, are no longer adequate.

A large fluctuation in temperature is common in the devices of the past. Such temperature fluctuation adversely affects the electronic components in these devices. Whereas the systems of the past attempted to remove heat only through the non-display sides and rear components of the enclosure surrounding the electronic display components, exemplary embodiments cause convective heat transfer from the face of the display as well. By the aspects described below, exemplary embodiments have made consistent cooling possible for electronic displays having screens of sizes greater than or equal to twelve inches. For example, cooling of a 55 inch screen can be achieved, even in extremely hot climates. Greater cooling capabilities are provided by the device and method described and shown in more detail below.

An exemplary embodiment relates to a front glass plate having a polarizer set in front of an electronic display so as to define an insulator gap between the front glass plate and the electronic display. The front glass may be set forward of the electronic display surface by spacers defining the depth of the insulator gap. The depth of the insulator gap may be adjusted depending on the application and environment in which the electronic display is used. The insulator gap may be anterior and coextensive with the viewable face of the electronic display surface. Because of the insulator gap the solar loading occurring on the front glass plate is not transferred to the electronic display surface.

Another exemplary embodiment relates to an isolated gas cooling system and a method for cooling an electronic display. An exemplary embodiment includes an isolated gas cooling chamber. The gas cooling chamber is preferably a closed loop which includes a first gas chamber comprising a transparent anterior plate and a second gas chamber comprising a cooling plenum. The first gas chamber is anterior to and coextensive with the viewable face of the electronic display surface. The transparent anterior plate may be set forward of the electronic display surface by spacers defining the depth of the first gas chamber. A cooling chamber fan, or equivalent means, maybe located within the cooling plenum. The fan may be used to propel gas around the isolated gas cooling chamber loop. As the gas traverses the first gas chamber it contacts the electronic display surface, absorbing heat from the surface of the display. Because the gas and the relevant surfaces of the first gas chamber are transparent, the image quality remains excellent. After the gas has traversed the transparent first gas chamber, the gas may be directed into the rear cooling plenum.

In order to cool the gas in the plenum, external convective or conductive means may be employed. In at least one embodiment, an external fan unit may also be included within the housing of the display. The external fan unit may be positioned to provide a flow of ingested air over the external surfaces of the plenum. The heated air in the housing may exit the housing as exhaust.

The first gas chamber may also act as an insulator for the electronic display. In outdoor environments, radiative heat from the sun is a major concern. As the surface areas of displays are increased the amount of solar loading also increases. To combat this solar loading the claimed invention provides a transparent anterior plate set forward of the electronic display. This area between the transparent anterior plate and the electronic display defines a first gas chamber. The gas chamber, as well as carrying away heat generated by the electronic display, also acts as an insulating barrier between the transparent anterior plate and the electronic display.

To further guard against solar loading of the electronic display, a linear polarizer may be employed at the transparent anterior plate. The linear polarizer serves to absorb a significant portion of the solar energy, in-turn reducing the solar loading on the electronic display. By significantly reducing the solar loading on the electronic display through he use of a gas chamber and the linear polarizer either together or separately, the temperature of the electronic display is significantly reduced. This reduction allows the cooling chamber to function more efficiently.

The foregoing and other features and advantages of the exemplary embodiments will be apparent from the following more detailed description of the particular embodiments of the invention, as illustrated in the accompanying drawings.

BRIEF DESCRIPTION OF THE DRAWINGS

A better understanding of an exemplary embodiment will be obtained from a reading of the following detailed description and the accompanying drawings wherein identical reference characters refer to identical parts and in which.

DETAILED DESCRIPTION

Exemplary embodiments relate to a cooling system for an electronic display and to combinations of the cooling system and the electronic display. Exemplary embodiments provide an isolated gas cooling system for an electronic display.

Figure 1:
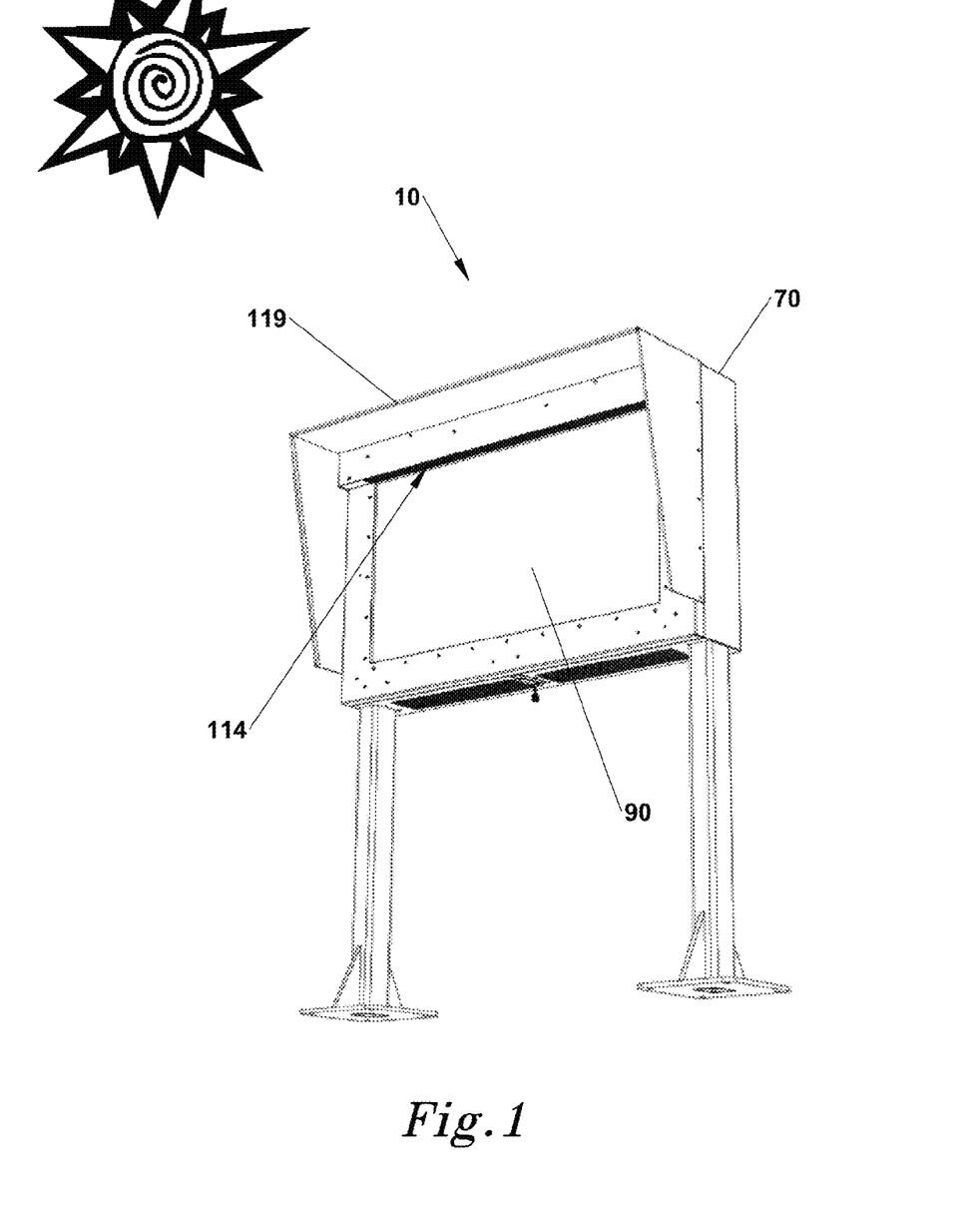
FIG. 1 is a perspective view of an exemplary embodiment in conjunction with an exemplary electronic display.

FIG. 1 illustrates an exemplary embodiment. As may be appreciated, when the display 10 is exposed to outdoor elements, the temperatures inside the display 10 will vary greatly without some kind of cooling device. As such, the electronics including the display screen (e.g., LCD screen) will have a greatly reduced life span. By implementing certain embodiments of the cooling system disclosed herein, temperature fluctuation is greatly reduced. This cooling capability has been achieved in spite of the fact that larger screens generate more heat than smaller screens.

The display shown is equipped with an innovative gas cooling system. Accordingly, it may be placed in direct sunlight. Although the cooling system may be used on smaller displays, it is especially useful for larger LCD, LED, or organic light emitting diodes (OLED) displays. These screens, especially with displays over 24 inches, face significant thermoregulatory issues in outdoor environments.

In FIG. 1, the display area of the electronic display shown includes a narrow gas chamber that is anterior to and coextensive with the electronic display surface. The display shown also is equipped with an optional air curtain device 114 which is the subject matter of co-pending U.S. application Ser. No. 11/941,728, incorporated by reference herein. Optionally, the display also has a reflection shield 119, to mitigate reflection of the sunlight on the display surface. Additionally, in outdoor environments, housing 70 is preferably a color which reflects sunlight.

It is to be understood that the spirit and scope of the disclosed embodiments includes cooling of displays including, but not limited to LCDs. By way of example and not by way of limitation, exemplary embodiments may be used in conjunction with displays selected from among LCD (including TFT or STN type), light emitting diode (LED), organic light emitting diode (OLED), field emitting display (FED), cathode ray tube (CRT), and plasma displays. Furthermore, exemplary embodiments may be used with displays of other types including those not yet discovered. In particular, it is contemplated that exemplary embodiments may be well suited for use with full color, flat panel OLED displays. While the embodiments described herein are well suited for outdoor environments, they may also be appropriate for indoor applications (e.g., factory environments) where thermal stability of the display may be at risk.

Figure 2:
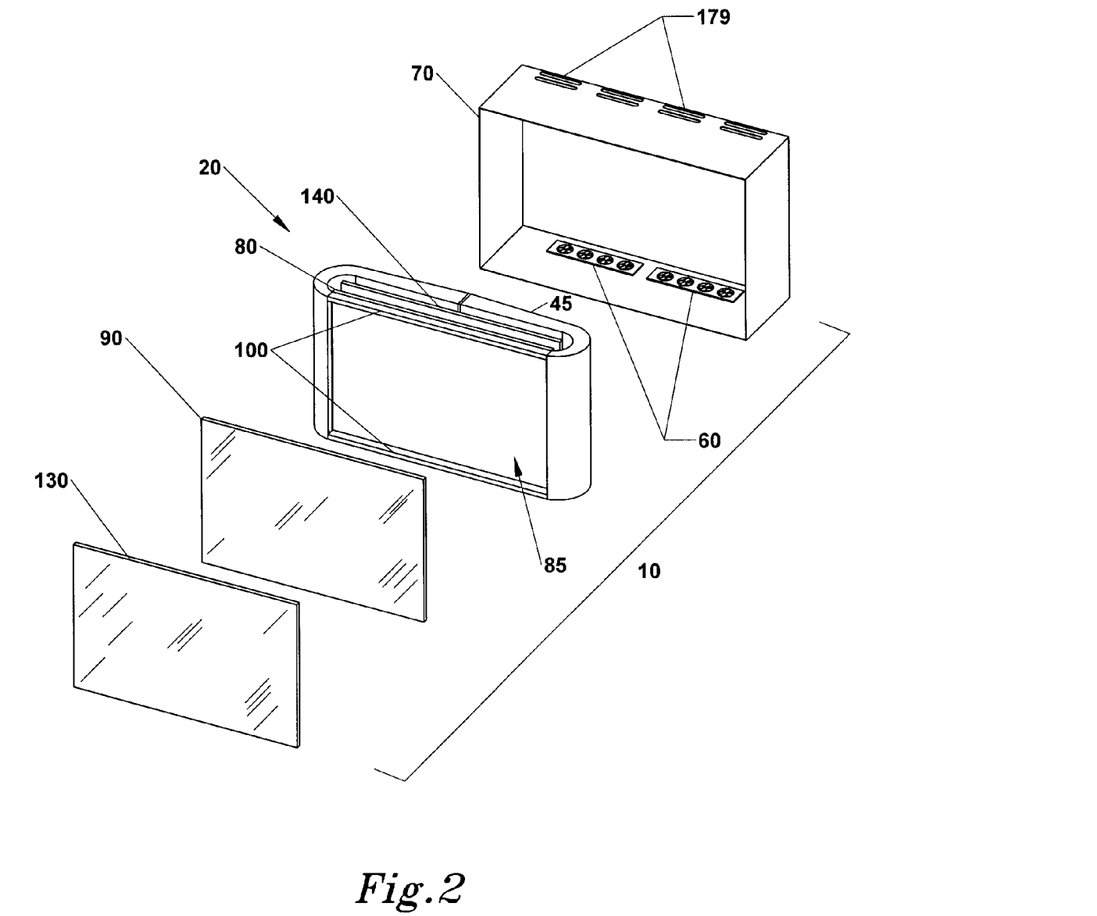
FIG. 2 is an exploded perspective view of an exemplary embodiment showing components of the isolated gas cooling system.

As shown in FIG. 2 an exemplary embodiment 10 of the electronic display and gas cooling system includes an isolated gas cooling chamber 20 contained within an electronic display housing 70. A narrow transparent first gas chamber is defined by spacers 100 and transparent first front plate 90. A transparent second front glass 130 may be laminated to the first front glass 90 to help prevent breakage of the first front glass 90. As shown in FIG. 2, cooling chamber 20 surrounds and LCD stack 80 and associated backlight panel 140.

The gas cooling system 10 shown in FIG. 2 may include means for cooling gas contained within the second gas chamber. These means may include a fan 60 which may be positioned at the base of the display housing 70. The fan will force the cooler ingested air over at least one external surface of a posterior cooling plenum 45. If desired, an air conditioner (not shown) may also be utilized to cool the air which contacts the external surface of plenum 45.

Figure 3:
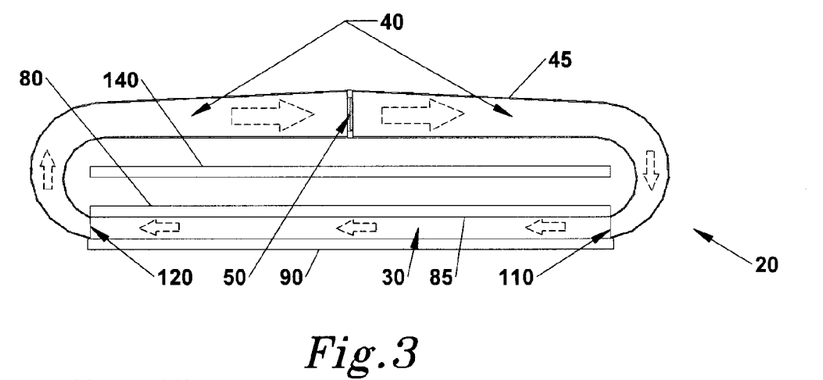
FIG. 3 is top plan view of an exemplary embodiment of the cooling chamber.

Referring to FIG. 3, in at least one embodiment the isolated gas cooling chamber 20 comprises a closed loop which includes a first gas chamber 30 (see FIG. 3) and a second gas chamber 40. The first gas chamber 30 includes a transparent first front glass 90. The second gas chamber 40 comprises a cooling plenum 45. The term "isolated gas" refers to the fact that the gas within the isolated gas cooling chamber 20 is essentially isolated from external air in the housing of the display. Because the first gas chamber 30 is positioned in front of the display image, the gas should be substantially free of dust or other contaminates that might negatively affect the display image.

The isolated gas may be almost any transparent gas, for example, normal air, nitrogen, helium, or any other transparent gas. The gas is preferably colorless so as not to affect the image quality. Furthermore, the isolated gas cooling chamber need not necessarily be hermetically sealed from the external air. It is sufficient that the gas in the chamber is isolated to the extent that dust and contaminates may not substantially enter the first gas chamber.

In the closed loop configuration shown in FIG. 3, the first gas chamber 30 is in gaseous communication with the second gas chamber 40. A cooling chamber fan 50 may be provided within the posterior plenum 45. The cooling fan 50 may be utilized to propel gas around the isolated gas cooling chamber 20. The first gas chamber 30 includes at least one first front glass 90 mounted in front of an electronic display surface 85. The first front glass 90 may be set forward from the electronic display surface 85 by spacers 100 (see FIG. 4). The spacing members 100 define the depth of the narrow channel passing in front of the electronic display surface 85. The spacing members 100 may be independent or alternatively may be integral with some other component of the device (e.g., integral with the front plate). The electronic display surface 85, the spacing members 100, and the transparent first front plate 90 define a narrow first gas chamber 30. The chamber 30 is in gaseous communication with plenum 45 through entrance opening 110 and exit opening 120.

As shown in FIG. 3, a posterior surface of the first gas chamber 30 preferably comprises the electronic display surface 85 of the display stack 80. As the isolated gas in the first gas chamber 30 traverses the display it contacts the electronic display surface 85. Contacting the cooling gas directly to the electronic display surface 85 enhances the convective heat transfer away from the electronic display surface 85.

Advantageously, in exemplary embodiments the electronic display surface 85 comprises the posterior surface of the first gas chamber 30. Accordingly, the term "electronic display surface" refers to the front surface of a typical electronic display (in the absence of the embodiments disclosed herein). The term "viewable surface" or "viewing surface" refers to that portion of the electronic display surface from which the electronic display images may be viewed by the user.

The electronic display surface 85 of typical displays is glass. However, neither display surface 85, nor transparent first front glass 90, nor optional transparent second front glass 130 need necessarily be glass. Therefore, the term "glass" will be used herein interchangeably with the term plate. By utilizing the electronic display surface 85 as the posterior surface wall of the gas compartment 30, there may be fewer surfaces to impact the visible light traveling through the display. Furthermore, the device will be lighter and cheaper to manufacturer.

Although the embodiment shown utilizes the electronic display surface 85, certain modifications and/or coatings (e.g., anti-reflective coatings) may be added to the electronic display surface 85, or to other components of the system in order to accommodate the coolant gas or to improve the optical performance of the device. In the embodiment shown, the electronic display surface 85 may be the front glass plate of a liquid crystal display (LCD) stack. However, almost any display surface may be suitable for embodiments of the present cooling system. Although not required, it is preferable to allow the cooling gas in the first gas chamber 30 to contact the electronic display surface 85 directly. In this way, the convective effect of the circulating gas will be maximized. Preferably the gas, which has absorbed heat from the electronic display surface 85 may then be diverted to the cooling plenum 45 where the collected heat energy in the gas may be dissipated into the air within the display housing 70 by conductive and or convective means.

To prevent breakage, the optional second front glass 130 may be adhered to the front surface of the first front glass 90. Alternatively first front glass 90 may be heat tempered to improve its strength. As shown in FIG. 3, fan 50 propels a current of air around the loop (see arrows) of the isolated gas cooling chamber 20. The plenum 45 defining the second gas chamber 40 is adapted to circulate the gas behind the electronic display surface 85. The plenum 45 preferably surrounds most of the heat generating components of the electronic display, for example, backlight panel 140 (e.g., an LED backlight).

Figure 4:
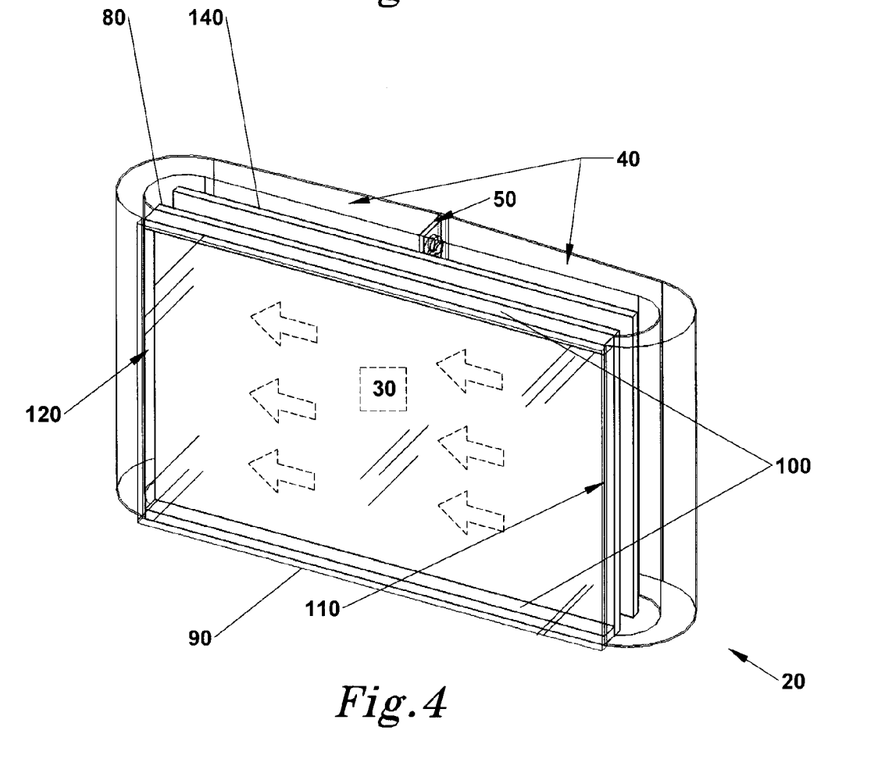
FIG. 4 is a front perspective view of an embodiment of the isolated cooling chamber, particularly the transparent anterior surface of first gas chamber.

FIG. 4 shows that the first front glass 90 helping define the first gas chamber 30 is transparent and is positioned anterior to and at least coextensive with a viewable area of an electronic display surface 85. The arrows shown represent the movement of the isolated gas through the first gas chamber 30. As shown, the isolated gas traverses the first gas chamber 30 in a horizontal direction. Although cooling system 20 may be designed to move the gas in either a horizontal or a vertical direction, it is preferable to propel the gas in a horizontal direction. In this way, if dust or contaminates do enter the first gas chamber 30, they will tend to fall to the bottom of chamber 30 outside of the viewable area of the display. The system may move air left to right, or alternatively, right to left.

As is clear from FIG. 4, to maximize the cooling capability of the system, the first gas chamber 30 preferably covers the entire viewable surface of the electronic display surface 85. Because the relevant surfaces of the first gas chamber 30 as well as the gas contained therein are transparent, the image quality of the display remains excellent. Anti-reflective coatings may be utilized to minimize specular and diffuse reflectance. After the gas traverses the first gas chamber 30 it exits through exit opening 120. Exit opening 120 defines the entrance junction into the rear cooling plenum 45.

Figure 5:
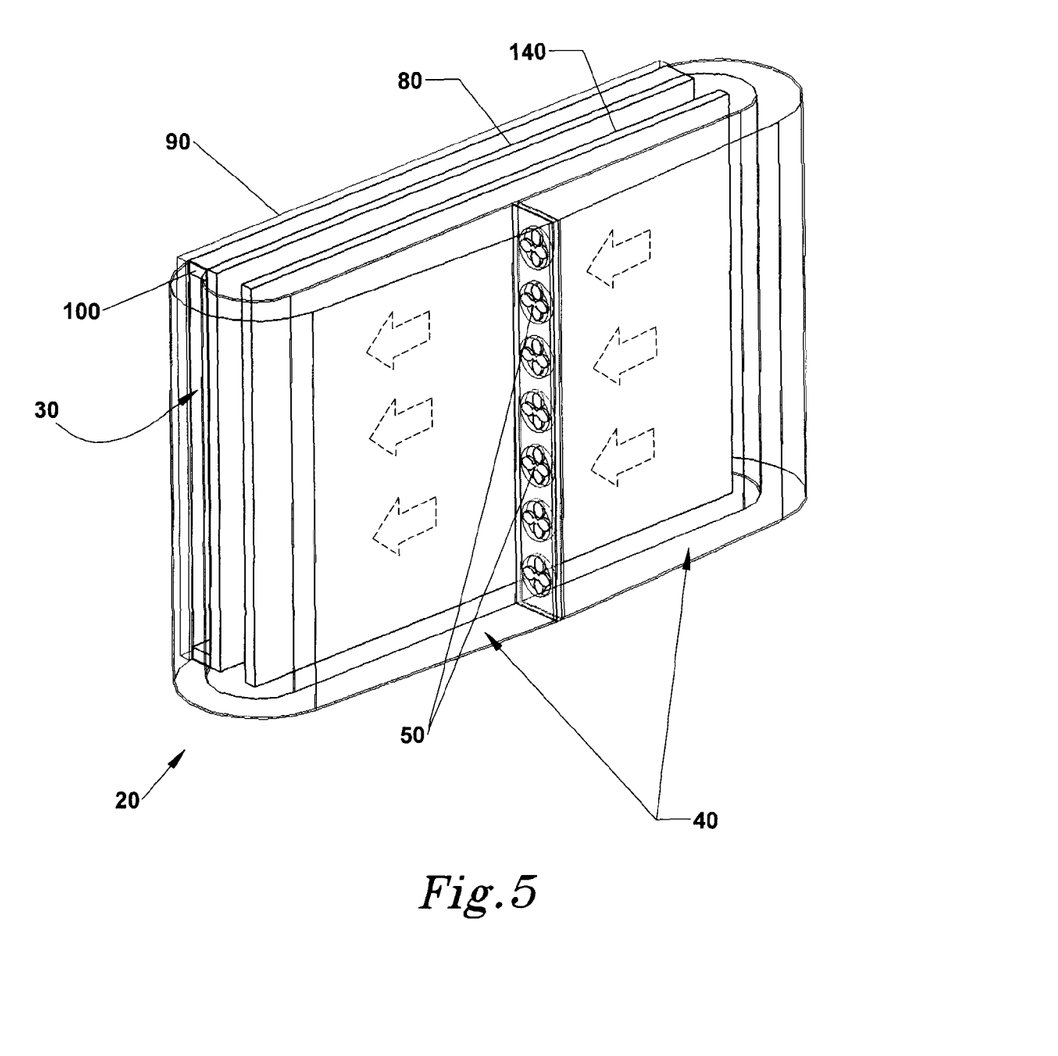
FIG. 5 is a rear perspective view of an embodiment of the isolated cooling chamber, particularly the cooling plenum.
Figure 11:
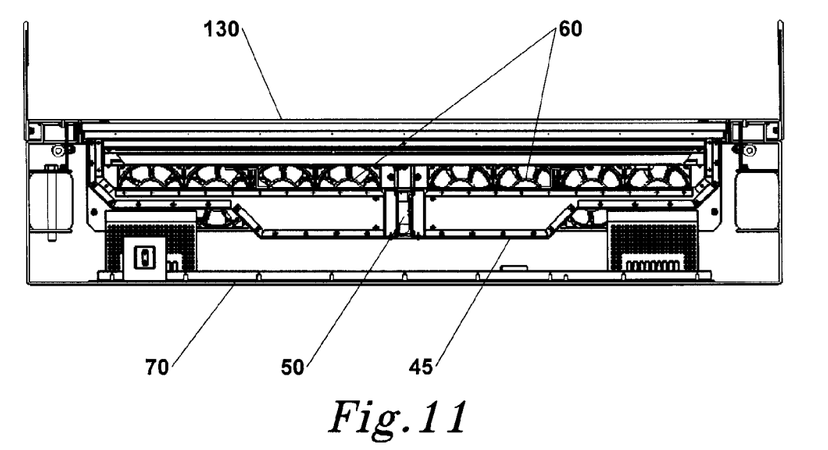
FIG. 11 is a cross-sectional top view through one exemplary embodiment.
Figure 12:
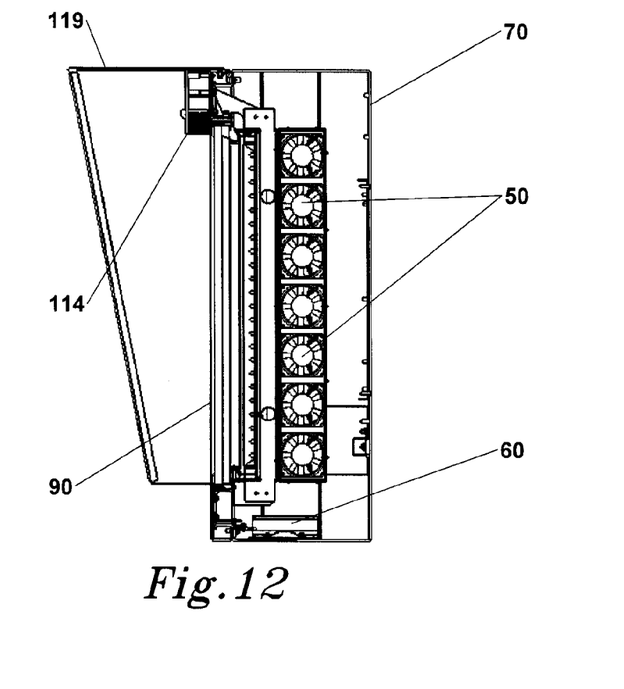
FIG. 12 is a cross-sectional side view through the center of the display.

FIG. 5 shows a schematic of the rear cooling plenum 45 (illustrated as transparent for explanation). One or more fans 50 within the plenum may provide the force necessary to move the isolated gas through the isolated gas cooling chamber. Whereas the first gas chamber 30 was designed to collect heat from the surface 85 of the display, the second gas chamber 40 is designed to dissipate that heat into the housing 70. Plenum 45 may have various contours and features to accommodate the internal structures within a given electronic display application. FIGS. 11 and 12 demonstrates one such alternative embodiment.

Figure 6:
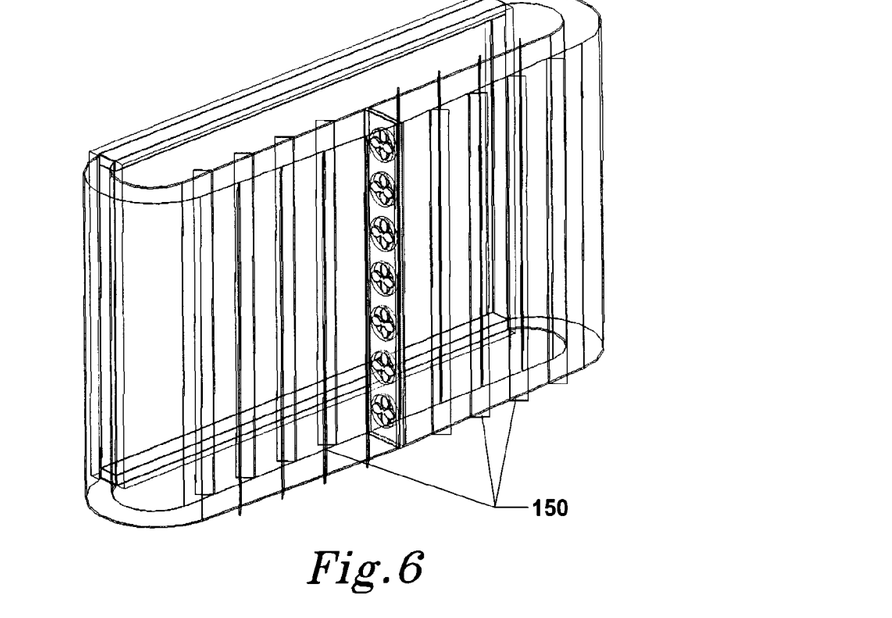
FIG. 6 is a rear perspective view of an embodiment of the isolated cooling chamber showing surface features that may be included on the plenum
Figure 7:
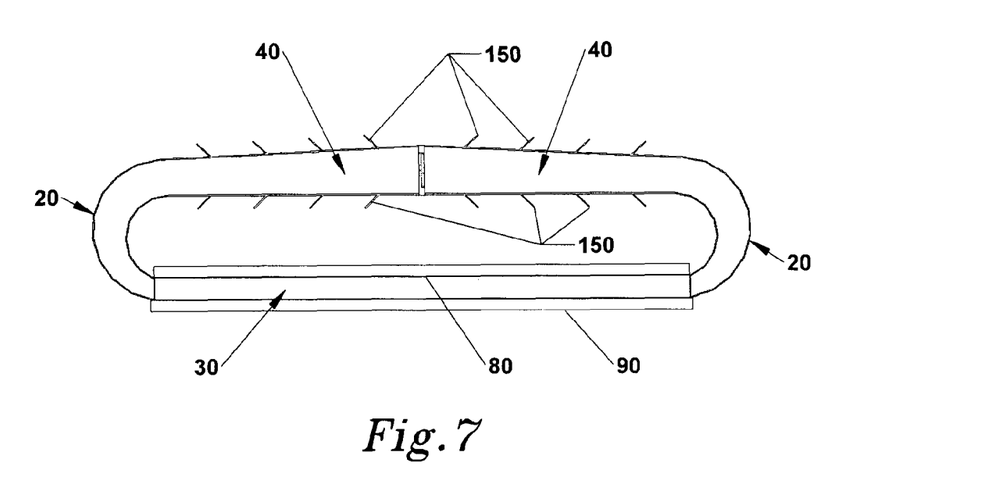
FIG. 7 is a top plan view of an exemplary embodiment of the cooling chamber showing surface features that may be included on the plenum.

As can be discerned in FIGS. 6 and 7, various surface features 150 may be added to improve heat dissipation from the plenum 45. These surface features 150 provide more surface area to radiate heat away from the gas within the second gas chamber 40. These features 150 may be positioned at numerous locations on the surface of the plenum 45.

Figure 8:
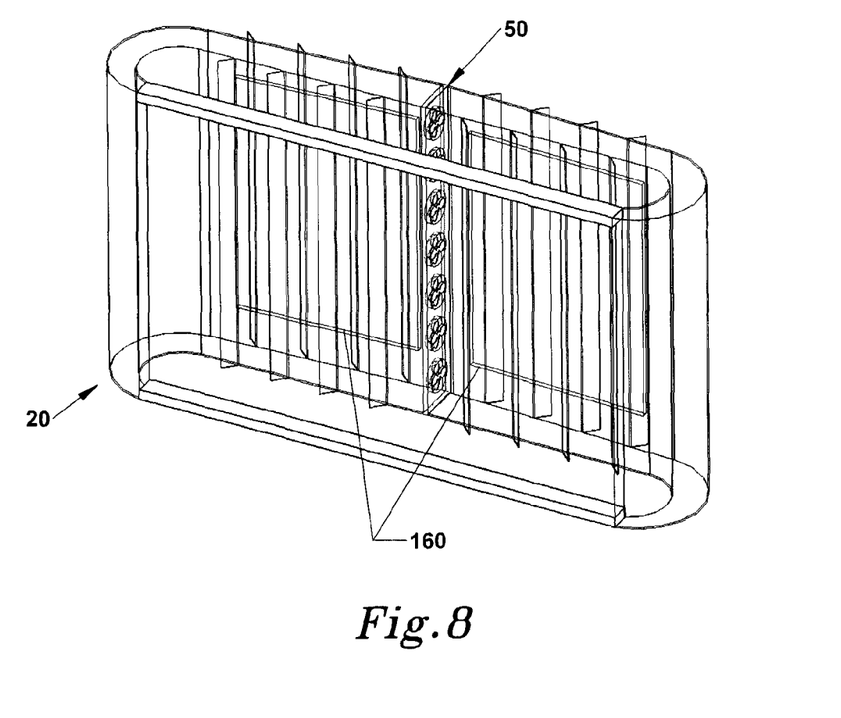
FIG. 8 is a front perspective view of an embodiment of the isolated cooling chamber with included thermoelectric modules.
Figure 9:
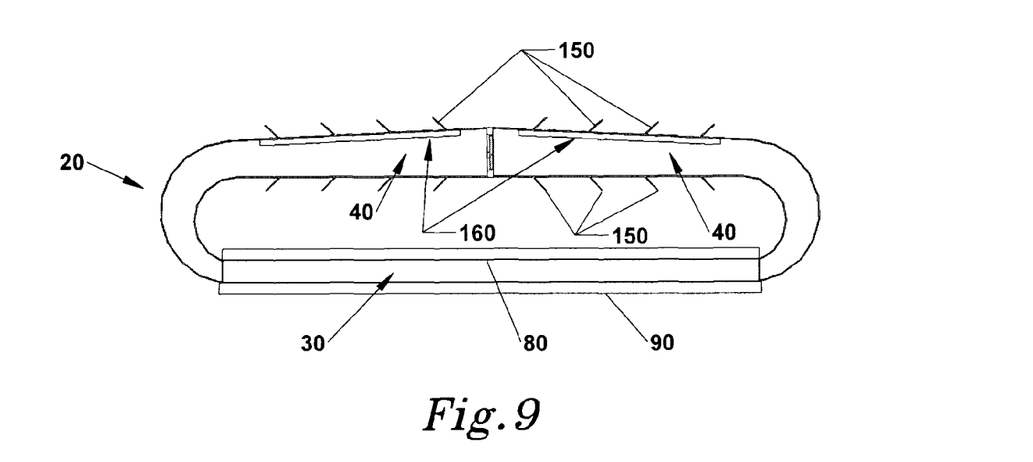
FIG. 9 is a top plan view of an exemplary embodiment of the cooling chamber with included thermoelectric modules.

Referring to FIGS. 8 and 9, one or more thermoelectric modules 160 may be positioned on at least one surface of the plenum 45 to further cool the gas contained in the second gas chamber 40. The thermoelectric modules 160 may be used independently or in conjunction with surface features 150. Alternatively, thermoelectric modules 160 may be useful to heat the gas in the rear plenum if the unit is operated in extreme cold conditions.

Figure 10:
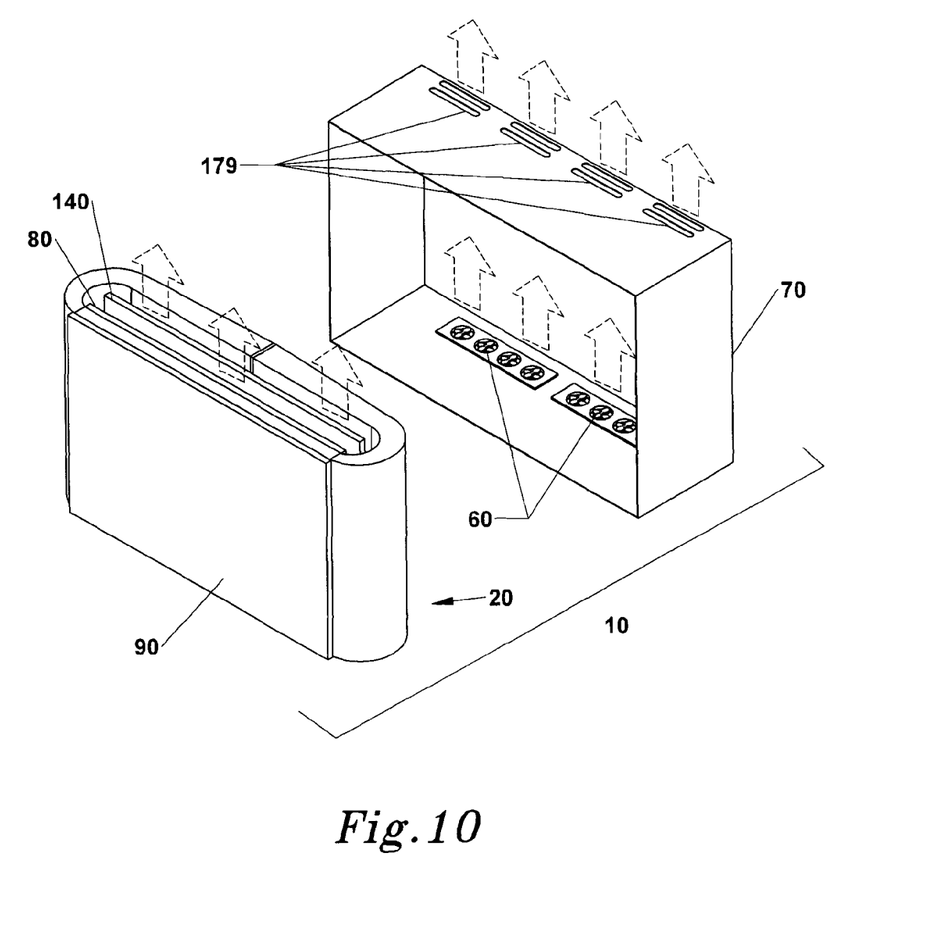
FIG. 10 is an exploded perspective view of an exemplary embodiment showing components of the isolated gas cooling system.

FIG. 10 shows an exemplary method for removing heat in the gas contained in the rear plenum 45. Fan 60 may be positioned to ingest external air and blow that air into the display housing 70. Preferably, the air will contact the anterior and posterior surfaces of the plenum 45. Furthermore, in this configuration, fan 60 will also force fresh air past the heat generating components of the electronic display (e.g., the TFT layer and the backlight) to further improve the cooling capability of the cooling system. The heated exhaust air may exit through one or more apertures 179 located on the display housing 70.

Besides thermoelectric modules 160, there are a number of ways to cool the gas in the second gas chamber. For example air conditioners or other cooling means known by those skilled in the art may be useful for cooling the gas contained in plenum 45.

FIG. 11 is a cross-sectional top view of an exemplary embodiment. Note that plenum 45 may have many possible shapes. In FIG. 11, the plenum tapers to allow for the placement of DC power converters.

FIG. 12 shows a side cross-section view of the embodiment shown in FIG. 11. In the arrangement shown, a fan unit 60 forces a flow of ingested air into the display housing 70. The air travels upward along both sides of plenum 45. In the exemplary embodiment shown in FIG. 12, the exhaust air is directed to exit toward the top-front of the display housing. In the embodiment shown, an optional air curtain device 114, described in Co-pending application Ser. No. 11/941,728, is included to direct the exhaust air back across the external surface of the first front glass 90 (or second front glass 130) of the cooling chamber. The external current of exhaust air may assist in removing even more heat from the electronic display surface 85. This embodiment also has an optional reflection shield 119 to help reduce reflection caused by the sun.

While the display is operational, the isolated gas cooling system may run continuously. However, if desired, a temperature sensor (not shown) and a switch (not shown) may be incorporated within the electronic display 10. The thermostat may be used to detect when temperatures have reached a predetermined threshold value. In such a case, the isolated gas cooling system may be selectively engaged when the temperature in the display reaches a predetermined value. Predetermined thresholds may be selected and the system may be configured with a thermostat (not shown) to advantageously keep the display within an acceptable temperature range.

An optional air filter (not shown) may be employed within the plenum to assist in preventing contaminates and dust from entering the first gas chamber 30.

In other embodiments, the electronics may be included in the isolated cooling system, such as described in Co-pending application Ser. No. 12/234,360.

Figure 13:
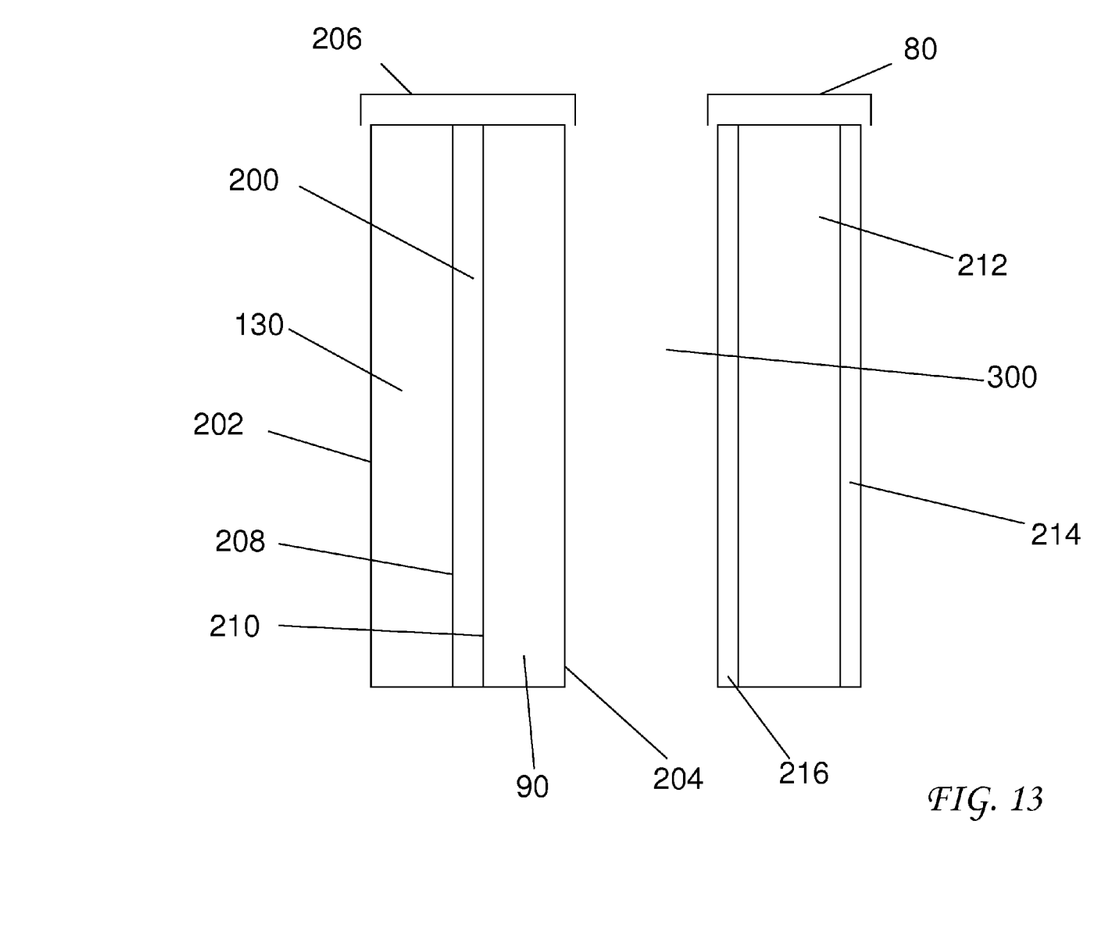
FIG. 13 is a cross-sectional view through one exemplary embodiment.

FIG. 13 is a cross-sectional view of an exemplary embodiment. In the arrangement shown, a first front glass 90 and a second front glass 130 may be laminated together. The first and second front glass 130 and 90 may be fixed to one another with a layer of index matched optical adhesive 200 to form a front glass unit 206. The first and second front glasses 130 and 90 may be laminated to one another through the process described in U.S. application Ser. No. 12/125,046. The LCD stack may comprise an electronic display 212 interposed between a front polarizer 216 and a rear polarizer 214. In other embodiments, the LCD may be any layer or surface used to construct an electronic display. The LCD stack 80 and the front glass unit 206 define an insulator gap 300. The depth of the insulator gap 300 may be controlled by spacers 100 (shown in FIG. 2). The insulator gap 300 serves to thermally separate the front glass unit 206 from the LCD stack 80. This thermal separation localizes the heat on the front glass unit rather than allowing solar loading of the LCD stack. In some embodiments, the insulator gap 300 may be devoid of any gaseous material. In other embodiments, the insulator gap 300 may be the first gas chamber 30. In other embodiments, the insulator gap 300 may be filled with any substantially transparent gas.

The second front glass may have a first surface 202 and a second surface 208. The first surface 202 may be exposed to the elements; while the second surface 208 may be fixed to the first front glass 90 by the index matched optical adhesive 200. The first front glass may have a third surface 210 and a fourth surface 204. The third surface 210 may be fixed to the second front glass 130 by the index matched optical adhesive 200; while the fourth surface may be directly adjacent to the insulator gap 300. In some embodiments, to decrease the solar loading of the LCD stack 80 and improve the viewable image quality, an anti-reflective coating may be applied to the first surface 202 and the fourth surface 204. In other embodiments, the anti-reflective coating may only be applied to at least one of the first, second, third, or fourth surface 202, 208, 210, and 204.

Figure 14:
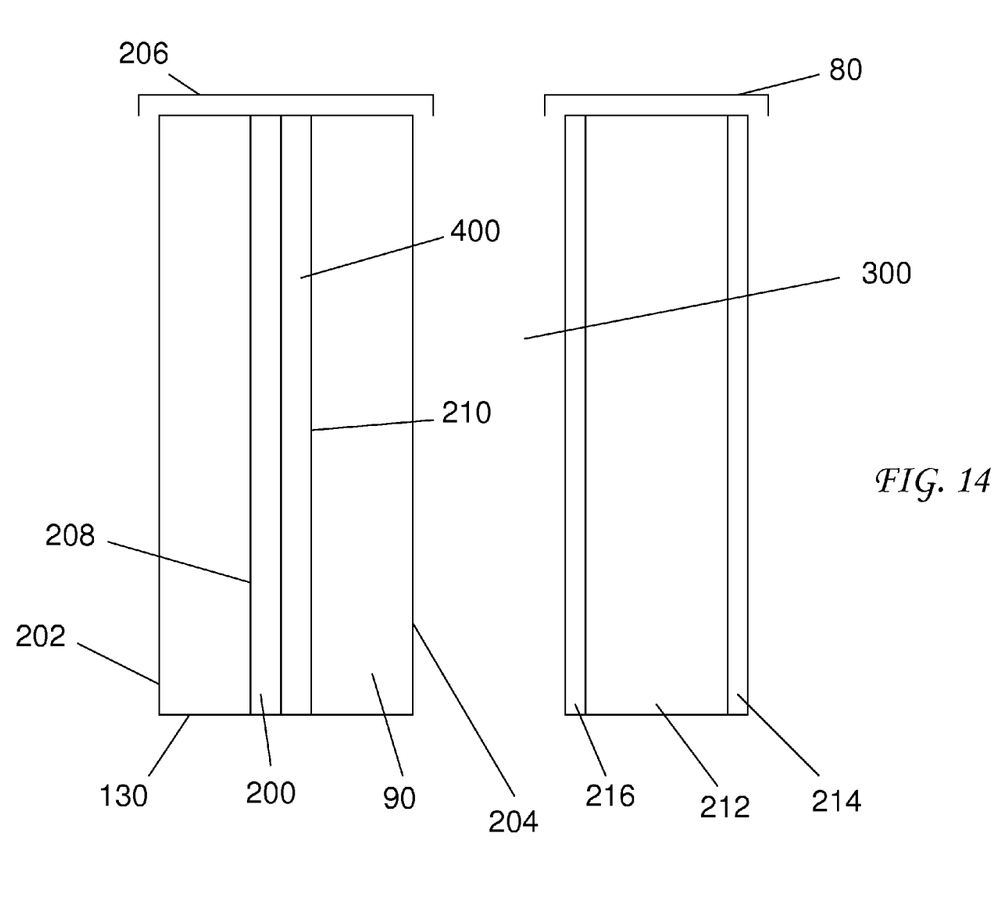
FIG. 14 is a cross-sectional view through one exemplary embodiment.

FIG. 14 is a cross-sectional view of another exemplary embodiment of the front glass unit 206. In the arrangement shown, the front glass unit 206 comprises a second front glass 130, a layer of index matched optical adhesive 200, a linear polarizer 400, and a first glass surface 90. The linear polarizer 300 may be bonded to the first, second, third or fourth surface 202, 208, 210, and 204. The linear polarizer 300 may be aligned with the front polarizer 210 found in the LCD stack 85. The inclusion of a linear polarizer 400 in the front glass unit 206, further decreases the solar load on the LCD stack 80. The reduction in solar loading may significantly reduce the temperature of the electronic display.

The inclusion of the linear polarizer 400 may not affect the viewing angle of the electronic display or the chromaticity over angle. Another beneficial aspect of including the linear polarizer 300 is a reduction in specular reflection of the front glass unit 206 and the LCD stack 80 by approximately 50%.

Figure 15:
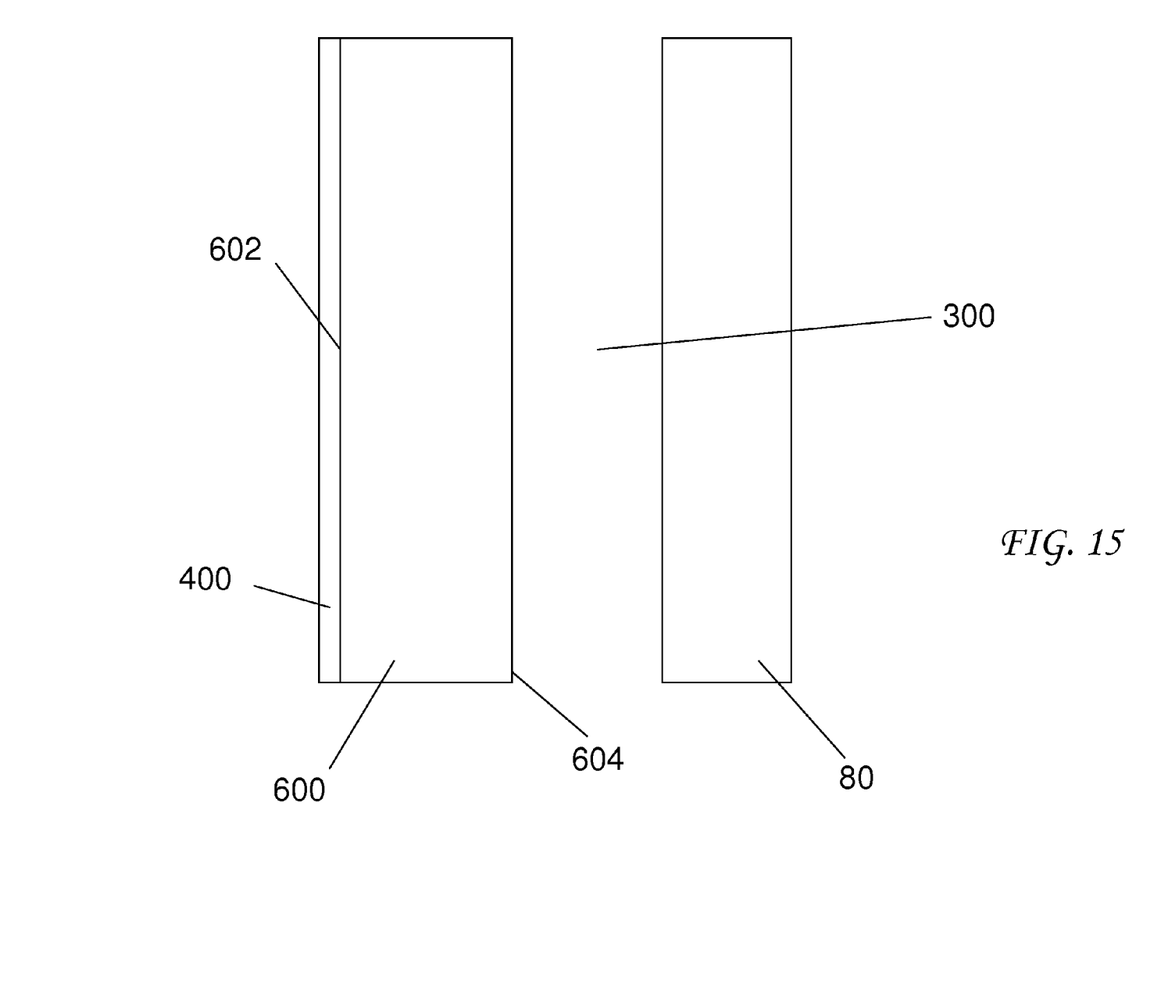
FIG. 15 is a cross sectional view of another exemplary embodiment.

FIG. 15 illustrates a cross sectional view of another exemplary embodiment. In the arrangement shown, a front glass 600 is positioned anterior to an LCD stack 80. The front glass 600 and LCD stack define an insulator gap 300. The front glass 600 and the LCD stack 80 are not in contact with one another as in other exemplary embodiments. The front glass 600 may have a first surface 602 and a second surface 604. The front glass 600 may also have a linear polarizer 400 on the either the first or second surfaces 602 and 604. In some exemplary embodiments, the insulator gap 300 may be a first gas chamber 30. As in other exemplary embodiments, the LCD stack 80 may include multiple layers forming a viewable display.

It should be understood that the LCD stack 80 may be replaced with any other type of electronic display, including, but not limited to, plasma displays, organic light emitting diode (OLED), CRT, and rear or front projection, Having shown and described a preferred embodiment of the invention, those skilled in the art will realize that many variations and modifications may be made to affect the described invention and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

What is claimed is:

1. A cooling system for an electronic display having a viewable area, the system comprising:
   a front glass unit positioned in front of the viewable area of the electronic display, the front glass unit including:
      a first front glass having a first and second surface;
      a second front glass having a third and fourth surface, bonded to the first front glass;
      a linear polarizer disposed on at least one of the surfaces;
   a first gas chamber positioned anterior to the viewable area of the electronic display;
   a second gas chamber positioned posterior to the viewable area of the electronic display and operatively connected to the first gas chamber to provide a closed loop for circulating gas; and
   a fan positioned to force ambient air between the first and second gas chambers such that the ambient air does not mix with the circulating gas.

2. The cooling system of claim 1, wherein the linear polarizer is interposed between the first and second front glasses.

3. The cooling system of claim 1, wherein the first and second front glasses are bonded together with an index matched optical adhesive.

4. The cooling system of claim 1, further comprising an anti-reflective coating on the first and second front glasses.

5. The cooling system of claim 1, further comprising a fan to propel gas through the first and second gas chambers.

6. The cooling system of claim 1, further comprising a means for cooling gas contained within the second gas chamber.

7. The cooling system of claim 1, further comprising spacers interposed between the front glass unit and the electronic display defining the depth of the first gas chamber.

8. A cooling system for an electronic display having a viewable area and a rear surface, the system comprising:
   a front glass unit, including:
      a first front glass having a first and second surface;
      a second front glass having a third and fourth surface, bonded to the first front glass;
      a linear polarizer disposed on at least one of the surfaces; and
   a fan positioned to force ambient air along the rear surface of the electronic display;
      wherein the front glass unit is positioned in front of the electronic display to define a first gas chamber positioned anterior to the viewable area of the electronic display;
   a second gas chamber positioned posterior to the viewable area of the electronic display and operatively connected to the first gas chamber so that gas may circulate through the first and second gas chamber; and
      wherein the ambient air is not permitted to enter the first gas chamber.

9. The cooling system of claim 8, wherein the linear polarizer is interposed between the first and second front glasses.

10. The cooling system of claim 8, wherein the first and second front glasses are bonded together with an index matched optical adhesive.

11. The cooling system of claim 8, further comprising an anti-reflective coating on the first and second front glasses.

12. The cooling system of claim 8, further comprising a fan to propel gas through the first and second gas chambers.

13. The cooling system of claim 8, further comprising a means for cooling gas contained within the second gas chamber.

14. A liquid crystal display assembly comprising:
   a liquid crystal stack having a front polarizer and rear polarizer;
   a backlight positioned behind the liquid crystal stack and having a rear surface facing away from the liquid crystal stack;
   a fan positioned to force ambient air along the rear surface of the backlight such that ambient air contacts the rear surface of the backlight;
   a front glass unit placed in front of the front polarizer and comprising a first front glass panel,
      a second front glass panel bonded to the first front glass panel, and
      an additional linear polarizer aligned with the front polarizer and placed between the first and second front glass panels; and
   an insulator gap placed between the front glass unit and the front polarizer,
   wherein the insulator gap is a first gas chamber positioned anterior to a viewable area of the liquid crystal stack;
   a second gas chamber positioned posterior to the viewable area of the liquid crystal stack and operatively connected to the first gas chamber to form a closed loop for circulating gas; and
   wherein the ambient air is not permitted to enter the insulator gap.

15. The liquid crystal display assembly of claim 14 further comprising:
   an anti reflective coating on the first front glass panel.

16. The liquid crystal display assembly of claim 14 further comprising:
   an anti reflective coating on the second front glass panel.

17. The liquid crystal display assembly of claim 14 further comprising:
   a fan positioned to drive the circulating gas around the closed loop.

18. The liquid crystal display assembly of claim 17 further comprising:
   a means for cooling the circulating gas.

19. The liquid crystal display assembly of claim 17 further comprising:
   a plenum placed behind the liquid crystal stack and accepting the circulating gas.

20. The liquid crystal display assembly of claim 19 further comprising:
   a fan positioned to draw external air over the plenum.

* * * * *

UNITED STATES PATENT AND TRADEMARK OFFICE
CERTIFICATE OF CORRECTION

PATENT NO. : 8,879,042 B2  Page 1 of 1
APPLICATION NO. : 12/237365
DATED : November 4, 2014
INVENTOR(S) : William Dunn It is certified that error appears in the above-identified patent and that said Letters Patent is hereby corrected as shown below:

On the Title Page

Item (63) Related U.S. Application Data, please delete "Continuation-in-part of application No. 12/234,307, filed on Sep. 19, 2008, and a continuation-in-part of application No. 12/234,360, filed on Sep. 19, 2008, and a continuation-in-part of application No. 12/235,200, filed on Sep. 22, 2008, and a continuation-in-part of application No. 11/941,728, filed on Nov. 16, 2007, and a continuation-in-part of application No. 12/191,384, filed on Aug. 14, 2008, now abandoned, and a continuation-in-part of application No. 12/125,046, filed on May 21, 2008." and insert -- Continuation-in-part of application No. 12/234,307, filed on Sep. 19, 2008, now Pat. No. 8,767,165, and a continuation-in-part of application No. 12/234,360, filed on Sep. 19, 2008, and a continuation-in-part of application No. 12/235,200, filed on Sep. 22, 2008, and a continuation-in-part of application No. 11/941,728, filed on Nov. 16, 2007, now Pat. No. 8,004,648, and a continuation-in-part of application No. 12/191,834, filed on Aug. 14, 2008, now Pat. No. 8,208,115, and a continuation-in-part of application No. 12/125,046, filed on May 21, 2008, now Pat. No. 8,562,770. --

Signed and Sealed this
Third Day of October, 2017

Joseph Matal
*Performing the Functions and Duties of the*
*Under Secretary of Commerce for Intellectual Property and*
*Director of the United States Patent and Trademark Office*